United States Patent
Chandrashekar et al.

(10) Patent No.: US 9,589,835 B2
(45) Date of Patent: *Mar. 7, 2017

(54) METHOD FOR FORMING TUNGSTEN FILM HAVING LOW RESISTIVITY, LOW ROUGHNESS AND HIGH REFLECTIVITY

(71) Applicant: Novellus Systems, Inc., Fremont, CA (US)

(72) Inventors: Anand Chandrashekar, Sunnyvale, CA (US); Raashina Humayun, Los Altos, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/934,089

(22) Filed: Jul. 2, 2013

(65) Prior Publication Data

US 2014/0017891 A1    Jan. 16, 2014

Related U.S. Application Data

(63) Continuation of application No. 13/412,534, filed on Mar. 5, 2012, now Pat. No. 8,501,620, which is a
(Continued)

(51) Int. Cl.
*H01L 21/44* (2006.01)
*H01L 21/768* (2006.01)
(Continued)

(52) U.S. Cl.
CPC ........ *H01L 21/76838* (2013.01); *C23C 16/14* (2013.01); *C23C 16/56* (2013.01); *H01L 21/28556* (2013.01)

(58) Field of Classification Search
CPC ......... H01L 21/28556; H01L 21/76838; C23C 16/14; C23C 16/56
See application file for complete search history.

(56) References Cited

U.S. PATENT DOCUMENTS 4,713,141 A * 12/1987 Tsang ................ H01L 21/32136
204/192.35
4,714,520 A    12/1987 Gwozdz
(Continued)

FOREIGN PATENT DOCUMENTS

CN    101899649 A    12/2010
CN    103125013 A    5/2013
(Continued)

OTHER PUBLICATIONS

US Final Office Action dated Oct. 7, 2013 issued in U.S. Appl. No. 12/535,377.
(Continued)

*Primary Examiner* — Mary Wilczewski
(74) *Attorney, Agent, or Firm* — Weaver Austin Villeneuve & Sampson LLP

(57) ABSTRACT

Top-down methods of increasing reflectivity of tungsten films to form films having high reflectivity, low resistivity and low roughness are provided. The methods involve bulk deposition of tungsten followed by a removing a top portion of the deposited tungsten. In particular embodiments, removing a top portion of the deposited tungsten involve exposing it to a fluorine-containing plasma. The methods produce low resistivity tungsten bulk layers having lower roughness and higher reflectivity. The smooth and highly reflective tungsten layers are easier to photopattern than conventional low resistivity tungsten films. Applications include forming tungsten bit lines.

20 Claims, 7 Drawing Sheets

Related U.S. Application Data continuation of application No. 12/332,017, filed on Dec. 10, 2008, now Pat. No. 8,129,270.

(51) Int. Cl.
  *C23C 16/14* (2006.01)
  *C23C 16/56* (2006.01)
  *H01L 21/285* (2006.01)

(56) References Cited

U.S. PATENT DOCUMENTS

| | | | |
|---|---|---|---|
| 4,804,560 A | 2/1989 | Shioya et al. | |
| 4,874,723 A | 10/1989 | Jucha et al. | |
| 4,891,550 A * | 1/1990 | Northrop et al. | 313/487 |
| 4,988,644 A | 1/1991 | Jucha et al. | |
| 4,997,520 A * | 3/1991 | Jucha et al. | 438/708 |
| 5,037,775 A | 8/1991 | Reisman | |
| 5,147,500 A * | 9/1992 | Tachi | C23F 4/00 |
| | | | 216/48 |
| 5,164,330 A | 11/1992 | Davis et al. | |
| 5,489,552 A | 2/1996 | Merchant et al. | |
| 5,719,410 A * | 2/1998 | Suehiro et al. | 257/77 |
| 5,747,379 A | 5/1998 | Huang et al. | |
| 5,767,015 A | 6/1998 | Tabara | |
| 5,807,786 A | 9/1998 | Chang | |
| 5,833,817 A * | 11/1998 | Tsai | H01L 21/76843 |
| | | | 204/192.17 |
| 5,861,671 A | 1/1999 | Tsai et al. | |
| 5,866,483 A | 2/1999 | Shiau et al. | |
| 5,893,758 A * | 4/1999 | Sandhu | H01L 21/31116 |
| | | | 257/E21.252 |
| 5,914,277 A * | 6/1999 | Shinohara | 438/720 |
| 5,990,020 A * | 11/1999 | Ha | H01L 21/32136 |
| | | | 257/E21.311 |
| 6,011,311 A | 1/2000 | Hsing et al. | |
| 6,030,881 A * | 2/2000 | Papasouliotis | C23C 16/045 |
| | | | 257/E21.546 |
| 6,100,193 A * | 8/2000 | Suehiro et al. | 438/685 |
| 6,110,822 A * | 8/2000 | Huang et al. | 438/657 |
| 6,184,158 B1 | 2/2001 | Shufflebotham et al. | |
| 6,221,754 B1 | 4/2001 | Chiou et al. | |
| 6,245,654 B1 | 6/2001 | Shih et al. | |
| 6,376,376 B1 | 4/2002 | Lim et al. | |
| 6,383,910 B2 * | 5/2002 | Okada et al. | 438/622 |
| 6,432,830 B1 | 8/2002 | Merry | |
| 6,436,809 B1 * | 8/2002 | Kwag et al. | 438/631 |
| 6,593,233 B1 | 7/2003 | Miyazaki et al. | |
| 6,607,985 B1 * | 8/2003 | Kraft et al. | 438/706 |
| 6,635,965 B1 | 10/2003 | Lee et al. | |
| 6,683,000 B2 | 1/2004 | Fukui et al. | |
| 6,696,337 B2 * | 2/2004 | Asano et al. | 438/253 |
| 6,828,226 B1 * | 12/2004 | Chen | H01L 21/0206 |
| | | | 257/E21.228 |
| 6,844,258 B1 | 1/2005 | Fair et al. | |
| 6,872,323 B1 | 3/2005 | Entley et al. | |
| 7,005,372 B2 | 2/2006 | Levy et al. | |
| 7,026,246 B2 * | 4/2006 | Yun | 438/693 |
| 7,115,516 B2 * | 10/2006 | Chen | C23C 14/046 |
| | | | 257/E21.169 |
| 7,141,494 B2 | 11/2006 | Lee et al. | |
| 7,193,369 B2 | 3/2007 | Min et al. | |
| 7,427,568 B2 * | 9/2008 | Chen | C23C 14/046 |
| | | | 204/192.3 |
| 7,504,725 B2 * | 3/2009 | Kim | H01L 21/28556 |
| | | | 257/751 |
| 7,578,944 B2 | 8/2009 | Min et al. | |
| 7,589,017 B2 | 9/2009 | Chan et al. | |
| 7,655,567 B1 | 2/2010 | Gao et al. | |
| 7,772,114 B2 | 8/2010 | Chan et al. | |
| 7,772,121 B2 * | 8/2010 | Chen | C23C 14/046 |
| | | | 438/692 |
| 7,955,972 B2 | 6/2011 | Chan et al. | |
| 7,993,460 B2 | 8/2011 | Steger | |
| 8,058,170 B2 | 11/2011 | Chandrashekar et al. | |
| 8,071,478 B2 | 12/2011 | Wu et al. | |
| 8,119,527 B1 | 2/2012 | Chadrashekar et al. | |
| 8,124,531 B2 | 2/2012 | Chandrashekar et al. | |
| 8,129,270 B1 | 3/2012 | Chandrashekar et al. | |
| 8,153,520 B1 | 4/2012 | Chandrashekar et al. | |
| 8,262,800 B1 | 9/2012 | Wongsenakhum et al. | |
| 8,399,351 B2 * | 3/2013 | Takahashi | 438/637 |
| 8,409,985 B2 | 4/2013 | Chan et al. | |
| 8,435,894 B2 | 5/2013 | Chandrashekar et al. | |
| 8,501,620 B2 * | 8/2013 | Chandrashekar | C23C 16/14 |
| | | | 257/E21.303 |
| 8,551,885 B2 | 10/2013 | Chen et al. | |
| 8,835,317 B2 * | 9/2014 | Chandrashekar | H01L 21/28556 |
| | | | 257/E21.586 |
| 8,883,637 B2 | 11/2014 | Jeng et al. | |
| 9,034,768 B2 * | 5/2015 | Chandrashekar | C23C 16/045 |
| | | | 438/675 |
| 9,082,826 B2 * | 7/2015 | Chandrashekar | H01L 21/76877 |
| 9,190,293 B2 * | 11/2015 | Wang | H01L 21/32136 |
| 9,240,347 B2 * | 1/2016 | Chandrashekar | H01L 21/76877 |
| 9,299,575 B2 * | 3/2016 | Park | H01L 21/3065 |
| 2002/0090811 A1 | 7/2002 | Kim et al. | |
| 2002/0132472 A1 | 9/2002 | Park | |
| 2002/0177325 A1 | 11/2002 | Takewaka et al. | |
| 2003/0017701 A1 | 1/2003 | Nakahara et al. | |
| 2003/0082902 A1 | 5/2003 | Fukui et al. | |
| 2003/0109145 A1 * | 6/2003 | Yun | 438/754 |
| 2003/0190802 A1 | 10/2003 | Wang et al. | |
| 2003/0194850 A1 | 10/2003 | Lewis et al. | |
| 2003/0235995 A1 * | 12/2003 | Oluseyi et al. | 438/710 |
| 2004/0025091 A1 | 2/2004 | Totman et al. | |
| 2004/0077616 A1 | 4/2004 | Bennani et al. | |
| 2004/0079632 A1 | 4/2004 | Ahmad et al. | |
| 2004/0142557 A1 | 7/2004 | Levy et al. | |
| 2004/0245091 A1 | 12/2004 | Karim et al. | |
| 2004/0266174 A1 * | 12/2004 | Yang | H01L 21/7684 |
| | | | 438/629 |
| 2005/0006222 A1 | 1/2005 | Ding et al. | |
| 2005/0031786 A1 | 2/2005 | Lee et al. | |
| 2005/0042829 A1 * | 2/2005 | Kim | H01L 21/28556 |
| | | | 438/268 |
| 2005/0179141 A1 | 8/2005 | Yun et al. | |
| 2005/0250316 A1 | 11/2005 | Choi et al. | |
| 2005/0275941 A1 | 12/2005 | Liu et al. | |
| 2006/0075966 A1 | 4/2006 | Chen et al. | |
| 2006/0084269 A1 | 4/2006 | Min et al. | |
| 2006/0094238 A1 | 5/2006 | Levy et al. | |
| 2006/0214244 A1 | 9/2006 | Minakata | |
| 2007/0006893 A1 | 1/2007 | Ji | |
| 2007/0187362 A1 | 8/2007 | Nakagawa et al. | |
| 2008/0054472 A1 | 3/2008 | Shinriki et al. | |
| 2008/0254623 A1 | 10/2008 | Chan et al. | |
| 2008/0318417 A1 | 12/2008 | Shinriki et al. | |
| 2009/0053893 A1 | 2/2009 | Khandelwal et al. | |
| 2009/0163025 A1 | 6/2009 | Humayun et al. | |
| 2010/0072623 A1 | 3/2010 | Prindle et al. | |
| 2010/0130002 A1 | 5/2010 | Dao et al. | |
| 2010/0144140 A1 | 6/2010 | Chandrashekar et al. | |
| 2010/0159694 A1 | 6/2010 | Chandrashekar et al. | |
| 2010/0240212 A1 | 9/2010 | Takahashi | |
| 2010/0267230 A1 | 10/2010 | Chandrashekar et al. | |
| 2011/0151670 A1 | 6/2011 | Lee et al. | |
| 2011/0159690 A1 | 6/2011 | Chandrashekar et al. | |
| 2011/0212274 A1 | 9/2011 | Selsley | |
| 2011/0233778 A1 | 9/2011 | Lee et al. | |
| 2012/0009785 A1 | 1/2012 | Chandrashekar et al. | |
| 2012/0077342 A1 | 3/2012 | Gao et al. | |
| 2012/0115329 A1 | 5/2012 | Chandrashekar et al. | |
| 2012/0164832 A1 | 6/2012 | Chandrashekar et al. | |
| 2013/0062677 A1 | 3/2013 | Li et al. | |
| 2013/0105303 A1 | 5/2013 | Lubomirsky et al. | |
| 2013/0171822 A1 | 7/2013 | Chandrashekar et al. | |
| 2013/0302980 A1 | 11/2013 | Chandrashekar et al. | |
| 2013/0330926 A1 | 12/2013 | Chandrashekar et al. | |
| 2014/0231896 A1 * | 8/2014 | Matsumori | H01L 29/401 |
| | | | 257/316 |
| 2014/0273451 A1 * | 9/2014 | Wang et al. | 438/675 |
| 2014/0349477 A1 | 11/2014 | Chandrashekar et al. | |
| 2015/0024592 A1 * | 1/2015 | Chandrashekar et al. | 438/675 |

(56) References Cited

U.S. PATENT DOCUMENTS

| | | | |
|---|---|---|---|
| 2015/0056803 A1 | 2/2015 | Chandrashekar et al. | |
| 2015/0111374 A1 | 4/2015 | Bao et al. | |
| 2015/0170935 A1* | 6/2015 | Wang | H01L 21/32136 438/720 |
| 2015/0262829 A1* | 9/2015 | Park | H01L 21/3065 438/720 |
| 2016/0020152 A1 | 1/2016 | Posseme | |
| 2016/0190008 A1 | 6/2016 | Chandrashekar et al. | |

FOREIGN PATENT DOCUMENTS

| | | | |
|---|---|---|---|
| EP | 1 055 746 | 11/2000 | |
| JP | H04-56130 | 2/1992 | |
| JP | H07-094488 | 4/1995 | |
| JP | H07-226393 | 8/1995 | |
| JP | H09-326436 | 12/1997 | |
| JP | 10-178014 A | 6/1998 | |
| JP | 2001-007048 | 1/2001 | |
| JP | 2001-274114 | 10/2001 | |
| JP | 2002-009017 | 1/2002 | |
| JP | 2002-305162 | 10/2002 | |
| JP | 2003-007677 | 1/2003 | |
| JP | 2003-142484 | 5/2003 | |
| JP | 2006-278496 | 10/2006 | |
| JP | 2007-251164 | 9/2007 | |
| JP | 2008-000742 | 1/2008 | |
| JP | 2008-057042 | 3/2008 | |
| JP | 2010-225697 | 10/2010 | |
| KR | 10-2001-0030488 | 4/2001 | |
| KR | 10-2003-0058853 | 7/2003 | |
| KR | 10-2004-0087406 | 10/2004 | |
| KR | 10-2005-0011479 | 1/2005 | |
| KR | 10-2005-0013187 | 2/2005 | |
| KR | 10-2006-0087844 | 8/2006 | |
| KR | 10-2010-0067065 | 8/2006 | |
| KR | 10-2007-0054100 | 5/2007 | |
| KR | 1201074 | 11/2012 | |
| TW | 557503 | 10/2003 | |
| WO | WO 99/67056 | * 12/1999 | H01L 21/302 |
| WO | WO 2013/148444 | 10/2013 | |
| WO | WO 2013/148880 | 10/2013 | |

OTHER PUBLICATIONS

US Office Action dated Jan. 6, 2014 issued in U.S. Appl. No. 13/888,077.
U.S. Patent Application entitled "Tungsten Feature Fill With Nucleation Inhibition," U.S. Appl. No. 13/774,350, filed Feb. 22, 2013.
U.S. Appl. No. 13/851,885, filed Mar. 27, 2013, entitled "Tungsten Feature Fill."
US Office Action dated Sep. 9, 2013 issued in U.S. Appl. No. 12/833,823.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
U.S. Patent Application entitled "Depositing Tungsten into High Aspect Ratio Features," U.S. Appl. No. 13/888,077, filed May 6, 2013.
US Office Action dated Dec. 30, 2009 issued in U.S. Appl. No. 12/332,017.
US Final Office Action dated Jul. 26, 2010 issued in U.S. Appl. No. 12/332,017.
US Office Action dated Nov. 15, 2010 issued in U.S. Appl. No. 12/332,017.
US Final Office Action dated Jul. 22, 2011 issued in U.S. Appl. No. 12/332,017.
US Notice of Allowance dated Oct. 28, 2011 issued in U.S. Appl. No. 12/332,017.
US Office Action dated Nov. 1, 2010 issued in U.S. Appl. No. 12/535,377.
US Office Action dated Jun. 14, 2011 issued in U.S. Appl. No. 12/535,377.
US Final Office Action dated Dec. 1, 2011 issued in U.S. Appl. No. 12/535,377.
US Office Action dated Mar. 7, 2013 issued in U.S. Appl. No. 12/535,377.
US Office Action dated Nov. 23, 2012 issued in U.S. Appl. No. 13/412,534.
US Notice of Allowance dated Apr. 8, 2013, issued in U.S. Appl. No. 13/412,534.
US Office Action dated Sep. 13, 2010 issued in U.S. Appl. No. 12/535,464.
US Final Office Action dated Apr. 14, 2011 issued in U.S. Appl. No. 12/535,464.
US Office Action dated Jul. 28, 2011 issued in U.S. Appl. No. 12/535,464.
US Office Action dated Oct. 12, 2011 issued in U.S. Appl. No. 12/535,464.
US Notice of Allowance dated Dec. 30, 2011 issued in U.S. Appl. No. 12/535,464.
US Office Action dated Sep. 2, 2011 issued in U.S. Appl. No. 12/534,566.
US Notice of Allowance dated Dec. 20, 2011 issued in U.S. Appl. No. 12/534,566.
US Office Action dated Mar. 13, 2012 issued in U.S. Appl. No. 12/833,823.
US Final Office Action dated Dec. 21, 2012 issued in U.S. Appl. No. 12/833,823.
US Office Action dated Nov. 25, 2011 issued in U.S. Appl. No. 13/016,656.
US Notice of Allowance dated Jan. 9, 2012 issued in U.S. Appl. No. 13/016,656.
US Office Action dated Mar. 27, 2012 issued in U.S. Appl. No. 13/351,970.
US Final Office Action dated Sep. 11, 2012 issued in U.S. Appl. No. 13/351,970.
US Notice of Allowance dated Jan. 9, 2013 issued in U.S. Appl. No. 13/351,970.
KR Office Action mailed Aug. 29, 2011 issued in Korean Appl. No. 10-2009-0122292.
KR Office Action mailed Jun. 26, 2012 issued in Korean Appl. No. 10-2009-0122292.
KR Office Action mailed Nov. 6, 2012, issued in Korean Appl. No. 2012-0104518.
SG Examination and Search Report dated Dec. 14, 2011 issued in Singapore Appl. No. 201005237-1.
KR Provisional Rejection mailed Nov. 16, 2012, issued in Korean Appl. No. 2011-0068603.
KR Office Action mailed Sep. 12, 2012 issued in Korean Appl. No. 2012-0104518.
Tsang, C.K. et al., "CMOS-Compatible Through Silicon Vias for 3D Process Integration", Materials Research Society 2007 Symposium Proceedings vol. 970, paper 0970-Y01-01.
Dimensions of Wafer as described by Wikepedia, 2008.
Deposition Process, Oxford Electronics, 1996.
Korean Patent Abstracts, Publication No. 1020030035877, published May 9, 2003, downloaded from http://kpa.kipris.or.kr/kpa2010 on Aug. 29, 2011.
US Final Office Action dated Apr. 1, 2014 issued in U.S. Appl. No. 12/833,823.
US Notice of Allowance, dated May 12, 2014 issued in U.S. Appl. No. 13/888,077.
JP Office Action dated Mar. 11, 2014 issued in Japanese Appl. No. 2009-278990.
TW Office Action dated Mar. 27, 2014, issued in Taiwan Appl. No. 098142115.
JP Office Action dated Feb. 25, 2014 issued in Japanese Appl. No. 2009-292610.
TW Office Action dated Apr. 29, 2014, issued in Taiwan Appl. No. 098146010.
U.S. Patent Application entitled, "Void Free Tungsten Fill in Different Sized Features", U.S. Appl. No. 14/341,646, filed Jul. 25, 2014.

(56) References Cited

OTHER PUBLICATIONS

U.S. Appl. No. 14/502,817, filed Sep. 30, 2014, entitled "Tungsten Feature Fill."
PCT International Preliminary Report on Patentability and Written Opinion, dated Oct. 9, 2014, issued in PCT/US2013/033174.
PCT International Preliminary Report on Patentability and Written Opinion, dated Oct. 9, 2014, issued in PCT/US2013/034167.
US Notice of Allowance dated Jan. 14, 2015 issued in U.S. Appl. No. 12/833,823.
US Office Action, dated Jan. 15, 2015, issued in U.S. Appl. No. 13/774,350.
US Office Action, dated Dec. 23, 2014, issued in U.S. Appl. No. 13/851,885.
US Office Action dated Dec. 18, 2014 issued in U.S. Appl. No. 14/502,817.
TW Office Action (Decision) dated Oct. 13, 2014, issued in Taiwan Application No. 098142115.
Chen et al., (Aug. 2003) "Advances in Remote Plasma Sources for Cleaning 300 mm and Flat Panel CVD Systems," Semiconductor Magazine, 6 pp.
Rosner et al., (1971) "Kinetics of the attack of refractory solids by atomic and molecular fluorine," The Journal of Physical Chemistry, 75(3):308-317.
U.S. Patent Application entitled, "Atomic Layer Etching of Tungsten for Enhanced Tungsten Deposition Fill," U.S. Appl. No. 14/830,683, filed Aug. 29, 2015.
US Notice of Allowance dated Mar. 18, 2015 issued in U.S. Appl. No. 14/285,505.
US Notice of Allowance dated May 14, 2015 issued in U.S. Appl. No. 14/285,505.
US Office Action dated Sep. 16, 2015 issued in U.S. Appl. No. 14/341,646.
US Examiner's Answer to Appeal Brief dated Apr. 17, 2015 issued in U.S. Appl. No. 12/535,377.
US Final Office Action dated Jul. 17, 2015 issued in U.S. Appl. No. 14/502,817.
US Notice of Allowance dated Sep. 25, 2015 issued in U.S. Appl. No. 14/502,817.
JP Final Office Action dated Mar. 17, 2015 issued in Japanese Application No. 2009-278990.
JP Office Action dated Feb. 10, 2015 issued in Japanese Application No. 2009292610.
SG Written Examination Report and Search Report dated Jun. 30, 2015 issued in Singapore Application No. 201303450-9.
U.S. Appl. No. 14/965,806, filed Dec. 10, 2015, entitled "Tungsten Feature Fill."
US Office Action dated Oct. 9, 2015 issued in U.S. Appl. No. 12/535,377.
US Office Action, dated Oct. 8, 2015, issued in U.S. Appl. No. 13/774,350.
SG Search and Examination Report dated Jan. 26, 2016 issued in Singapore Application No. 201303450-9.
Chinese Office Action [no translation] dated Feb. 26, 2016, issued in CN 201380022648.2.
U.S. Patent Application entitled, "Pulsing RF Power in Etch Process to Enhance Tungsten Gapfill Performance," U.S. Appl. No. 15/240,807, filed Aug. 18, 2016.
US Office Action dated Apr. 8, 2016 issued in U.S. Appl. No. 14/341,646.
US Notice of Allowance dated Sep. 9, 2016 issued in U.S. Appl. No. 14/341,646.
US Office Action dated Jul. 1, 2016 issued in U.S. Appl. No. 14/830,683.
US Final Office Action dated May 5, 2016 issued in U.S. Appl. No. 12/535,377.
US Office Action, dated Jun. 2, 2016, issued in U.S. Appl. No. 13/774,350.
US Notice of Allowance, dated Aug. 3, 2016, issued in U.S. Appl. No. 13/851,885.
US Office Action dated Sep. 2, 2016 issued in U.S. Appl. No. 14/965,806.
Japanese Office Action (Examiner's Report to the Appeal Board of the Japan Office).
Korean Office Action [no translation] dated Sep. 26, 2016, issued in Application No. KR 10-2013-0054726.
Chinese First Office Action dated Feb. 26, 2016, issued in Application No. CN 201380022648.2.
Chinese First Office Action dated Mar. 18, 2016 issued in Application No. CN 201380022693.8.
Carver et al. (Feb. 20, 2015) "Atomic Layer Etching: An Industry Perspective," ECS Journal of Solid State Science and Technology,4(6):N5005-N5009.

\* cited by examiner

METHOD FOR FORMING TUNGSTEN FILM HAVING LOW RESISTIVITY, LOW ROUGHNESS AND HIGH REFLECTIVITY

CROSS-REFERENCE TO RELATED APPLICATIONS

This application is a continuation of and claims priority from copending U.S. patent application Ser. No. 13/412,534, filed Mar. 5, 2012, titled "METHOD FOR DEPOSITING TUNGSTEN FILM HAVING LOW RESISTIVITY, LOW ROUGHNESS AND HIGH REFLECTIVITY," which claims priority to U.S. patent application Ser. No. 12/332,017, filed Dec. 10, 2008, and issued as U.S. Pat. No. 8,129,270 on Mar. 6, 2012, titled "METHOD FOR DEPOSITING TUNGSTEN FILM HAVING LOW RESISTIVITY, LOW ROUGHNESS AND HIGH REFLECTIVITY," all of which are incorporated herein by this reference for all purposes.

FIELD OF INVENTION

This invention relates to methods for preparing tungsten films. Embodiments of the invention are useful for integrated circuit applications that require tungsten films having low electrical resistivity, low roughness and high reflectivity.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

SUMMARY OF INVENTION

Top-down methods of increasing reflectivity of tungsten films to form films having high reflectivity, low resistivity and low roughness are provided. The methods involve bulk deposition of tungsten followed by a removing a top portion of the deposited tungsten. In particular embodiments, removing a top portion of the deposited tungsten involve exposing it to a fluorine-containing plasma. The methods produce low resistivity tungsten bulk layers having lower roughness and higher reflectivity. The smooth and highly reflective tungsten layers are easier to photopattern than conventional low resistivity tungsten films. Applications include forming tungsten bit lines.

In certain embodiments, methods of depositing tungsten films involving chemical vapor deposition are provided. The deposited films are etched back, e.g., using a NF3 remote plasma. Tungsten film roughness and reflectivity are improved by etching off sharp tungsten peaks and other non-uniformities that dominate the deposited film surface. Additionally, resistivity is improved over a regularly deposited film of identical final thickness. Unlike previous methods of roughness reduction, which increase resistivity, resistivity and roughness are improved simultaneously in the methods described herein.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the present invention, which pertains to forming thin tungsten films. Modifications, adaptations or variations of specific methods and structures shown and discussed herein will be apparent to those skilled in the art and are within the scope of this invention.

Embodiments of the present invention involve depositing tungsten layers that have low resistivity and low roughness. In previous processes, resistivity and roughness of tungsten film have been inversely related; lowering resistivity results in increased roughness and vice-versa. As a result, percentage root mean square (RMS) roughness to film thickness may exceed 10% for low resistivity tungsten films of 500 Å or greater. Lowering the roughness of the film makes subsequent operations, including patterning, easier.

The methods described also provide highly reflective films. Conventional processes for depositing bulk tungsten layers involve hydrogen reduction of tungsten-containing precursors in chemical vapor deposition (CVD) processes. The reflectivity of a 1000 A film that is grown by conventional hydrogen reduction CVD is 110% or less compared to that of a silicon surface. In certain applications, however, tungsten films having greater reflectivity are needed. For example, tungsten films having low reflectivity and high roughness can make photopatterning tungsten, e.g., to form bitlines or other structures, more difficult.

Methods of depositing reflective tungsten films having low resistivity that involve CVD deposition of tungsten in the presence of alternating nitrogen gas pulses are described in U.S. patent application Ser. No. 12/202,126, entitled "Method For Reducing Tungsten Roughness And Improving Reflectivity," filed Aug. 29, 2008, and incorporated by reference herein. Other prior techniques for roughness reductions, reflectivity improvement or resistivity reduction involve modifying the process chemistry. In certain applications, however, the addition of nitrogen or other modifications to the process chemistry may be undesirable. For example, step coverage, plugfill degradation and electrical performance degradation due to the presence of incompatible elements arise from these bottom-up methods. The methods described herein, by contrast, can be used with any deposition chemistry without modification. In certain embodiments, for example, there is no nitrogen exposure during the deposition.

In certain embodiments, the methods provided herein involve bulk deposition of a tungsten layer via chemical vapor deposition on a substrate followed by an etch-back of a top portion of a deposited bulk layer. The resulting tungsten film has resistivity comparable to that of a film deposited by conventional large grain tungsten CVD processes, but with much higher reflectivity and lower roughness.

Figure 1:
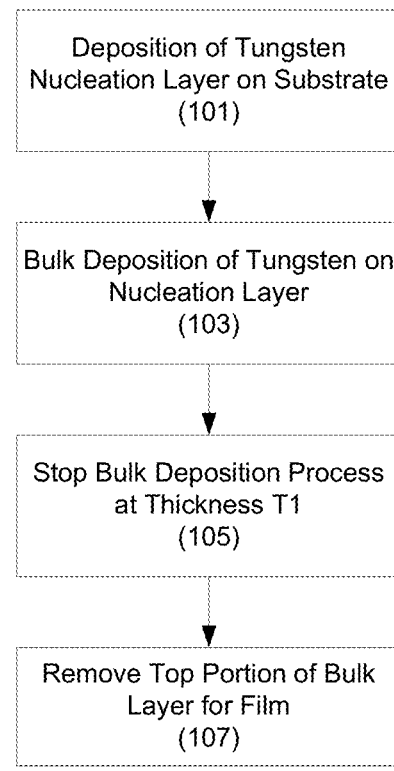
FIG. 1 is a process flow sheet showing relevant operations of methods according to various embodiments.

FIG. 1 shows a process according to certain embodiments of the invention. The process begins by depositing a tungsten nucleation layer on a substrate. Block 101. In general, a nucleation layer is a thin conformal layer which serves to facilitate the subsequent formation of a bulk material thereon. In certain embodiments, the nucleation layer is deposited using a pulsed nucleation layer (PNL) technique. In a PNL technique, pulses of the reducing agent, purge gases, and tungsten-containing precursors are sequentially injected into and purged from the reaction chamber. The process is repeated in a cyclical fashion until the desired thickness is achieved. PNL broadly embodies any cyclical process of sequentially adding reactants for reaction on a semiconductor substrate.

PNL techniques may be used in particular for the deposition of low resistivity films in small features. As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. Low resistivity tungsten films minimize power losses and overheating in integrated circuit designs. Because the $\rho_{nucleation} > \rho_{bulk}$, the thickness of the nucleation layer should be minimized to keep the total resistance as low as possible. The tungsten nucleation should also be sufficiently thick to fully cover the underlying substrate to support high quality bulk deposition.

PNL techniques for depositing tungsten nucleation layers that have low resistivity and that support deposition of low resistivity tungsten bulk layers are described in U.S. patent application Ser. Nos. 12/030,645, 11/951,236 and 61/061,078, incorporated by reference herein. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference. In certain embodiments, low resistivity treatment operations are performed during or after the tungsten nucleation layer deposition. The methods described herein are not limited to a particular method of tungsten nucleation layer deposition, but include deposition bulk tungsten film on tungsten nucleation layers formed by any method including PNL, atomic layer deposition (ALD), CVD, and any other method.

Returning to FIG. 1, after the tungsten nucleation layer is deposited, and any desired treatment has been performed, a bulk tungsten layer of thickness T1 is deposited on the nucleation layer. Block 103. Thickness T1 is typically greater than the total desired thickness Td to account for the portion of the layer to be removed during the etch operation. In certain embodiments, bulk deposition involves a chemical vapor deposition (CVD) process in which a tungsten-containing precursor is reduced by hydrogen to deposit tungsten. While tungsten hexafluoride (WF6) is often used, the process may be performed with other tungsten precursors, including, but not limited to, WCl6. In addition, while hydrogen is generally used as the reducing agent in the CVD deposition of the bulk tungsten layer, other reducing agents including silane may be used in addition or instead of hydrogen without departing from the scope of the invention. In another embodiment, W(CO)6 may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface.

Once a layer having thickness T1 is deposited, the bulk deposition process is halted. Block 105. As discussed further below, T1 is greater than the final desired thickness Td. A top portion of the layer is then removed or etched back. Block 107. In certain embodiments, the etching process involves a plasma etch. This may involve introducing activated species (including radicals, ions and/or high energy molecules) from a remote plasma generator. In certain embodiments, the removal operation involves a fluorine-based plasma etch, e.g., a remote NF3 plasma etch. The extent of the etch-back is discussed further below, though in certain embodiments, about 10% of the layer deposited in operation 103 is removed.

The flow of fluorine activated species (or other species depending on the removal chemistry) is then shut off. Typically, the process is complete at this point if the deposited thickness after etch-back is the desired total thickness. In certain embodiments, at least one additional deposition-removal cycle is performed to deposit the tungsten layer.

Figure 1A:
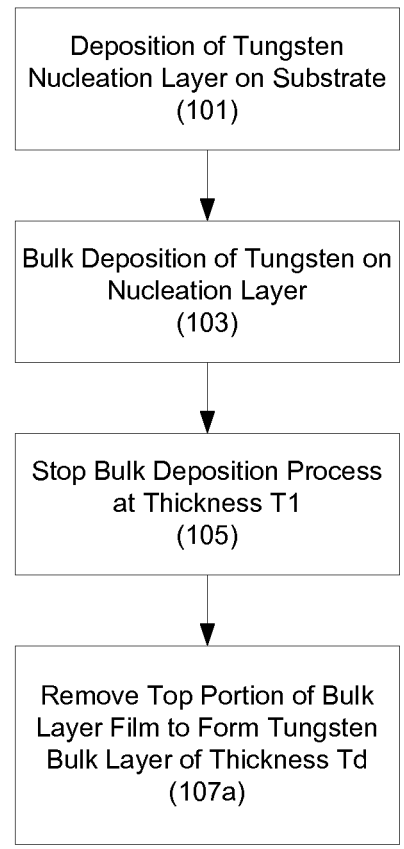
FIG. 1A is a process flow sheet showing relevant operations of methods according to various embodiments.

FIG. 1A shows a process flow sheet with block 101, 103 and 105 described above with reference to FIG. 1. In block 107a, a top portion of the bulk layer is removed to form a tungsten bulk layer of thickness Td. As discussed below, the top portion may be between 5% and 25% of the thickness T1.

The method described above produces films having higher reflectivity and lower roughness than films deposited by conventional methods having identical thicknesses. For example, in one experiment, reflectivity (as compared to a bare silicon wafer) of a 1940 Å film as deposited was 103%. After exposure to a remote NF3 plasma to remove 200 Å, reflectivity was 115%. By contrast, a 1720 Å film deposited by CVD with no etch back had a reflectivity of 106%. Additionally, resistivity of the etch tungsten film is lower than a conventionally deposited film of the same thickness—in certain embodiments, about 20% lower. This is significant because an increase in reflectivity is accompanied by an increase in resistivity in conventional methods.

Figure 2:
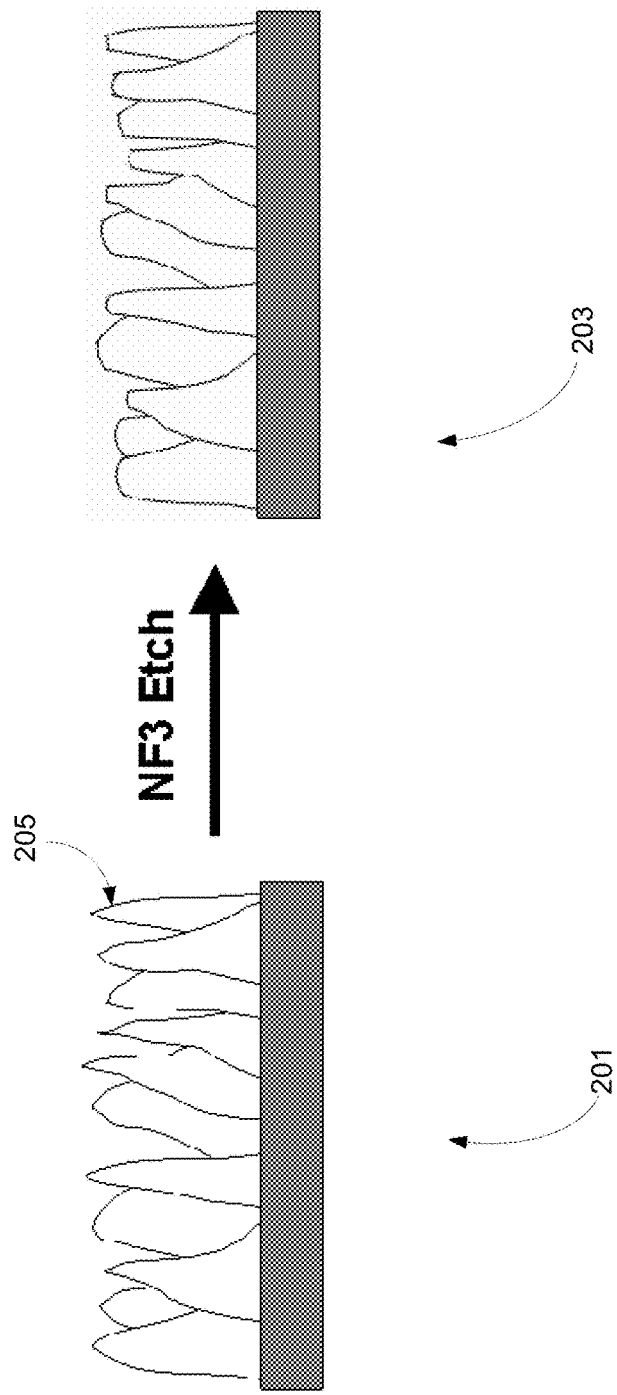
FIG. 2 is a schematic diagram illustrating the change in tungsten film grain structure after etching according to various embodiments.

Typically, low resistivity is achieved by large grain growth, while smoothness and high reflectivity is achieved by using small grain deposition. Tungsten grain growth occurs in lateral and vertical directions. In certain embodiments, the methods descried herein involve growing large grain tungsten in a bulk deposition process. After deposition, the vertically-oriented grain growth is selectively etched. After etching, the large laterally-oriented growth remains, providing low resistivity, while reflectivity is increased and roughness is significantly reduced. This is illustrated in FIG. 2, which shows schematic illustrations of the tungsten layer before (201) and after (203) a fluorine-based remote etched. The layer shown at 203 is about 90% as that shown in 201. Prior to the etch, sharp peaks, such as peak 205, are present. These peaks cause difficulties in subsequent lithographic patterning. After the etch, however, the grain profile is more flat, making the surface more reflective.

Figure 3:
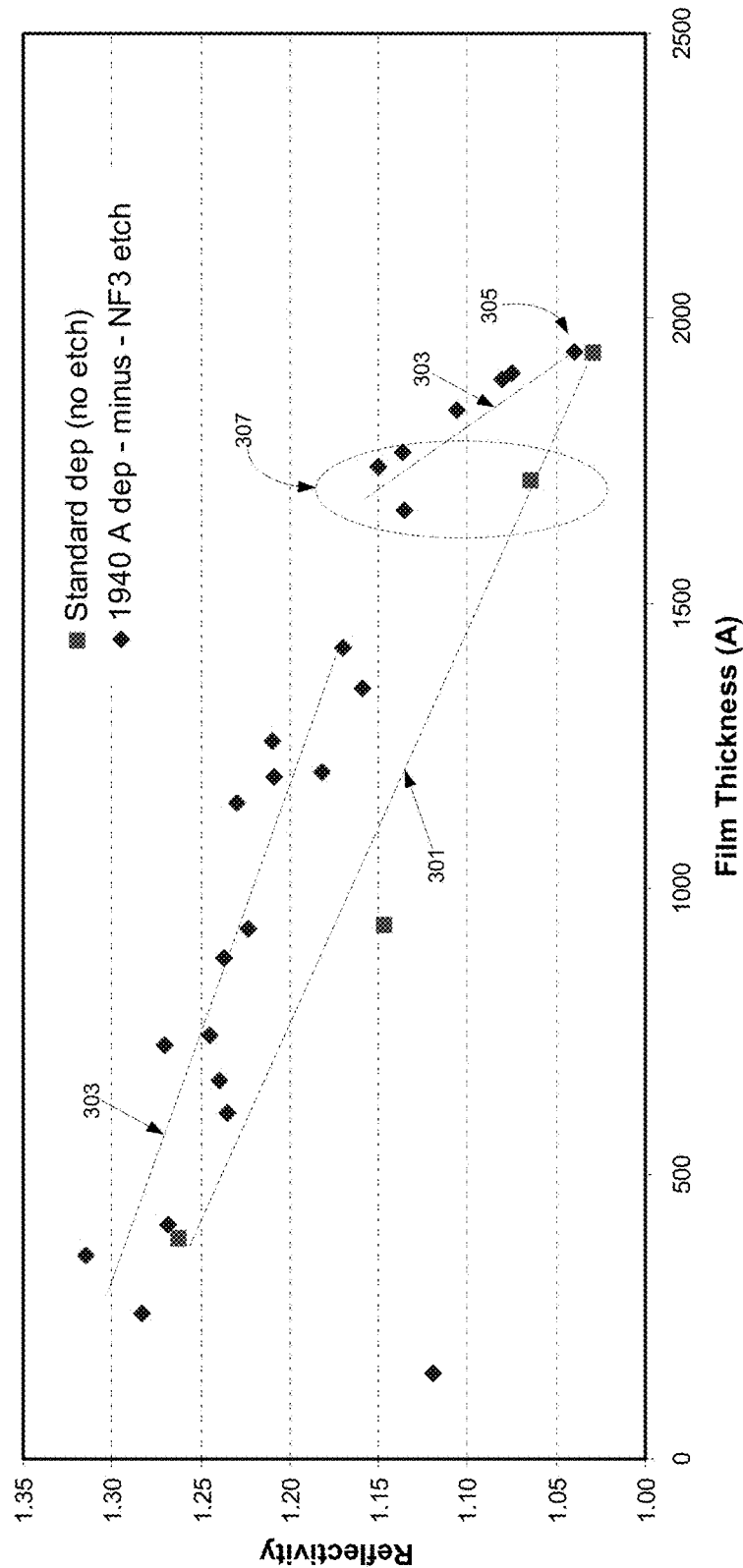
FIG. 3 is a graph showing reflectivity as a function of film thicknesses for films formed by an embodiment of the methods described herein as compared to films formed by conventional CVD deposition.

Not only does the etch process result in a more reflective surface compared to the unetched layer 201 as shown in FIG. 2, but resistivity and roughness are also improved for a film of comparable thickness. FIG. 3 is a graph showing reflectivity for films of various thicknesses as deposited by a conventional method (CVD deposition to the indicated thickness) and films as deposited by an embodiment of the invention (CVD deposition of 1940 Å+etch back to the indicated thickness). Rough trendlines 301 and 303 show reflectivity as a function of thickness for conventional deposition and for deposition+etch-back, respectively. As can be seen from the figure, there is a rapid increase in reflectivity, as compared to the conventional layer, from an insignificant portion etched (at 305) to about 200 Å etched. The improvement in reflectivity then flattens out as more film is etched. A maximum impact region (indicated at 307) shows the range of thicknesses removed in the etch operation that results in greatest improvement in reflectivity. This corresponds to about 10% of the as-deposited film thickness. Thus, in certain embodiments, the final film thickness is between about 75-95%, or more particularly, 80-95% of the as-deposited film thickness. This corresponds to a removal of 5-25%, or more particularly, 5-20%, of the top portion of the as-deposited film. Without being bound by a particular theory, it is believed that the maximum impact region etch-back corresponds to the peaks of the as-deposited film being removed. The top-down etch operation selectively removes the peaks because there is more surface area near the peaks of the as-deposited film. By stopping the etch process before the lower regions are etched, only the peaks are removed, leaving the lateral growth of the grains intact. As indicated, however, resistivity is unexpectedly also found to be lower following the etch process as compared to the same layers prior to etching. Without being bound by a particular theory, it is believed that this unexpected effect may be due to the grain boundaries being less defined after the etch operation. As discussed further below, in certain embodiments, resistivity is further improved (lowered) by using certain etch operation process conditions.

The removal operation may be any physical or chemical removal operation that can be used to remove a top portion of the as-deposited film. Etch chemistries that may be employed include fluorine-containing etch chemistries, including using xenon difluoride, molecular fluorine and nitrogen trifluoride. Bromine and chlorine-containing compounds, including nitrogen trichloride, molecular chlorine and molecular bromine. In certain embodiments, the etch may be a plasma etch. The plasma may be generated remotely or in the chamber. In a particular embodiment, NF3 is fed to a remote plasma generator. Activated species, including atomic fluorine, are generated within the remote plasma generator and flowed into the chamber for the chemical etch.

Etchant pressure has been found to affect film resistivity, with higher pressure resulting in lower resistivity. This effect is demonstrated in FIG. 4, which presents a graph showing resistivity of films of various thicknesses. Films deposited using conventional direct CVD deposition (squares) and films deposited to 1940 Å and etched to the indicated thickness (diamonds). The graph shows the partial pressure of the NF3 as introduced to the remote plasma generator for various thicknesses of films formed by deposition and etching. Curve 401 is a rough trendline showing resistivity as a function of thickness for films deposited using low NF3 partial pressure (0.17 and 0.24 Torr) and curve 403 is a rough trendline of showing resistivity as a function of thickness for films deposited using high NF3 partial pressure (1 Torr). Using high partial pressure results in films having lower resistivity. The improvement in resistivity is also seen comparing data points 405 and 407, representing reflectivity of a conventionally deposited film and a high NF3 etched film, respectively, both films of thickness about 930 Å. The conventionally deposited film has a resistivity of almost 18 micro-ohm-cm, whereas the high NF3 film has a resistivity of less than 16 micro-ohm-cm—a greater than 20% improvement.

In certain embodiments, the partial pressure of the etchant as introduced to a remote plasma generator is above 0.5 Torr, and as high as 80 Torr. In particular embodiments, the partial pressure of the etchant is about 1 Torr as flowed into the remote plasma generator, or deposition chamber.

Comparing the resistivity of the conventionally deposited films to that of etched films of comparable thicknesses (e.g., at about 400 Å and about 900 Å), the resistivity of the etched films is less than that of the conventionally deposited films. Resistivity improves for both high flow (high partial pressure) etchant as well as low flow (low partial pressure) etchant over conventionally deposited film. This is shown in the table below:

| Process | As-deposited Thickness (Å) | Final Thickness (Å) | Resistivity as-deposited (micro-ohm-cm) | Final resistivity (micro-ohm-cm) |
| --- | --- | --- | --- | --- |
| Conventional | 1720 | 1720 | 15.5 | 15.5 |
| Dep - Low NF3 Etch | 1940 | 1740 | 15 | 15 |
| Conventional (estimated from trendline) | 1350 | 1350 | 17 | 17 |
| Dep - High NF3 Etch | 1940 | 1350 | 15 | 14.3 |

With conventional deposition, there is an inverse relationship between resistivity and thickness: resistivity decreases with increasing thickness. Using the methods described herein however, it is possible to obtain low resistivity thin films. This process may be used to deposit thin films having low resistivity, with final thin film thickness ranging according to various embodiments, from 100 Å to 1000 Å. For thin films, the final film thickness may be between 10%-90% of the as-deposited film, i.e., as much as 90% of the as-deposited film may be removed to create the low resistivity thin film.

In addition to chemical etching, the top portion may be removed in certain embodiments by sputtering, e.g., with argon, or by a very soft chemical mechanical planarization (CMP) method such as touch CMP.

In another embodiment, the chamber is simultaneously cleaned while the etch process takes place. By introducing a fluorine-based etchant into the chamber, tungsten deposited on the interior parts of the chamber may be removed while the deposited tungsten layer is etched. By simultaneously cleaning the chamber while etching, the necessity of independent chamber clean operations is reduced or eliminated.

EXPERIMENTAL

Tungsten films were deposited on tungsten nucleation layers on semiconductor wafers using a conventional hydrogen reduction of WF6 CVD process. Films of 389 Å, 937 Å, 1739 Å and 1942 Å (center thickness) were deposited. Reflectivity and resistivity were measured for all films.

Tungsten films were deposited on tungsten nucleation layers using a deposition-etch process in accordance with that described in FIG. 1. A hydrogen reduction of WF6 CVD process was used to deposit the films. Deposition conditions were the same as for the conventionally deposited films. As deposited thickness for all films was about 1940 Å (ranging from 1935 Å to 1947 Å). A remote NF3 plasma was used to etch the films, with etch amounts ranging from 1 Å to 1787 Å, resulting in final thicknesses ranging from 151 Å to 1941 Å. NF3 partial pressure was set at one of the following levels: 0.02 Torr, 0.17 Torr, 0.24 Torr or 1 Torr. Reflectivity and resistivity were measured for all films after etching.

Reflectivity improves by about 10% after etch as compared to conventionally deposited films of comparable thickness. Results of the reflectivity measurements are shown in FIG. 3 and discussed above.

Figure 4:
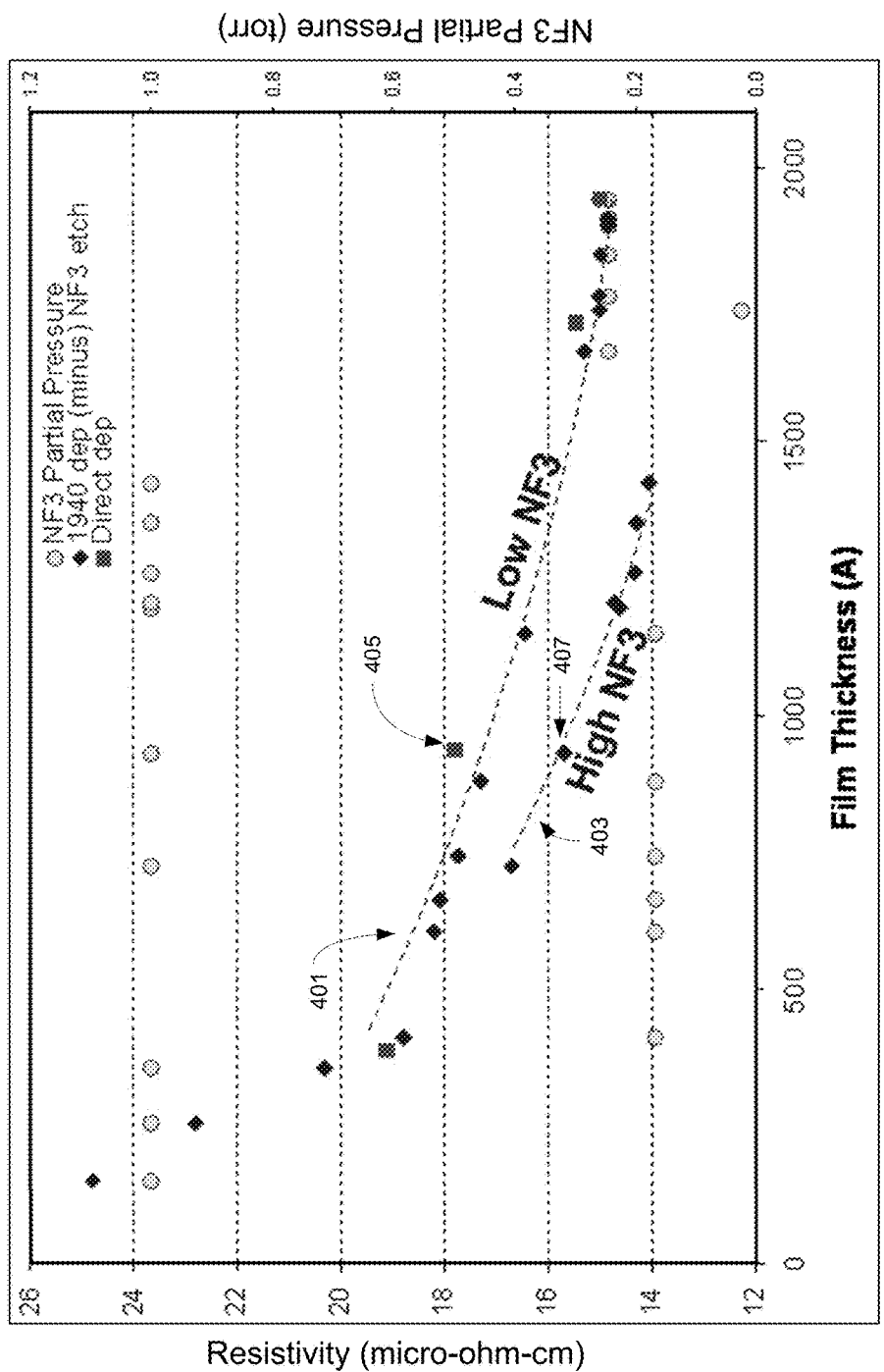
FIG. 4 is a graph showing resistivity as a function of film thicknesses for films formed by an embodiment of the methods described herein as compared to films formed by conventional CVD deposition.

Results of the resistivity measurements are shown in FIG. 4 and discussed above.

Roughness is also improved over the conventionally deposited films. For example, AFM roughness of a 1940 Å film as deposited was 9.7 nm. After NF3 etch of about 20 nm to 1740 Å, roughness was reduced by 2.5 nm to 9.2 nm. Roughness of a conventionally deposited 1720 Å film was 9 nm. Roughness is improved by about 20% over the conventionally deposited films.

Apparatus

Figure 5:
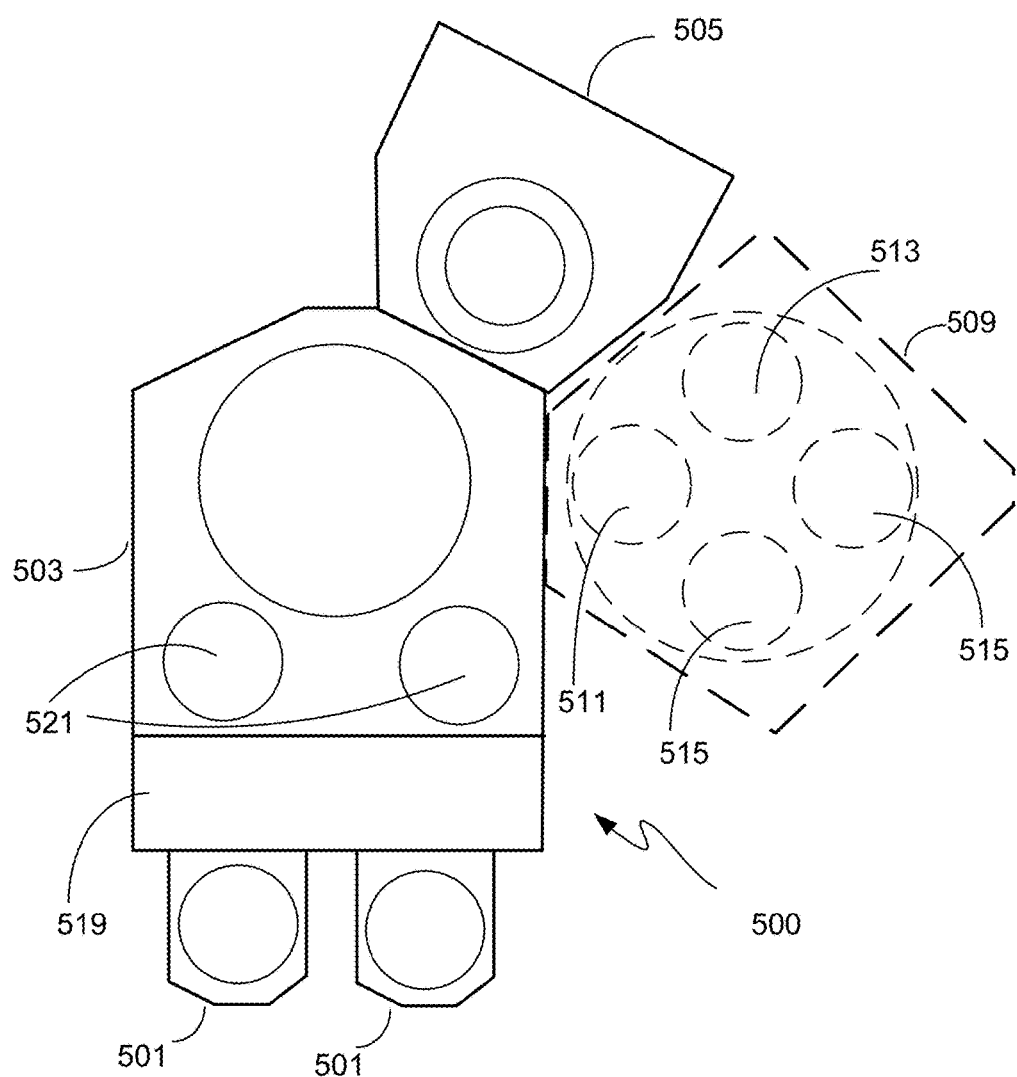
FIG. 5 is a block diagram of a processing system suitable for conducting tungsten deposition processes in accordance with embodiments of the invention.

FIG. 5 is a block diagram of a processing system suitable for conducting tungsten deposition processes in accordance with embodiments of the invention. The system 500 includes a transfer module 503. The transfer module 503 provides a clean, pressurized environment to minimize the risk of contamination of substrates being processed as they are moved between the various reactor modules. Mounted on the transfer module 503 is a multi-station reactor 509 capable of performing PNL deposition and CVD according to embodiments of the invention. Chamber 509 may include multiple stations 511, 513, 515, and 517 that may sequentially perform these operations. For example, chamber 509 could be configured such that station 511 performs PNL deposition, station 713 performs a nucleation layer treatment, and stations 513 and 515 perform CVD and etch operations. Alternatively, the etch operation may be performed in a different station as the CVD deposition. In certain embodiments, the deposition and etch operations may be performed in separate tools.

Also mounted on the transfer module 503 may be one or more single or multi-station modules 507 capable of performing plasma or chemical (non-plasma) pre-cleans. The module may also be used for various other treatments, e.g., post liner tungsten nitride treatments. The system 500 also includes one or more (in this case two) wafer source modules 501 where wafers are stored before and after processing. An atmospheric robot (not shown) in the atmospheric transfer chamber 519 first removes wafers from the source modules 501 to loadlocks 521. A wafer transfer device (generally a robot arm unit) in the transfer module 503 moves the wafers from loadlocks 521 to and among the modules mounted on the transfer module 503.

Figure 6:
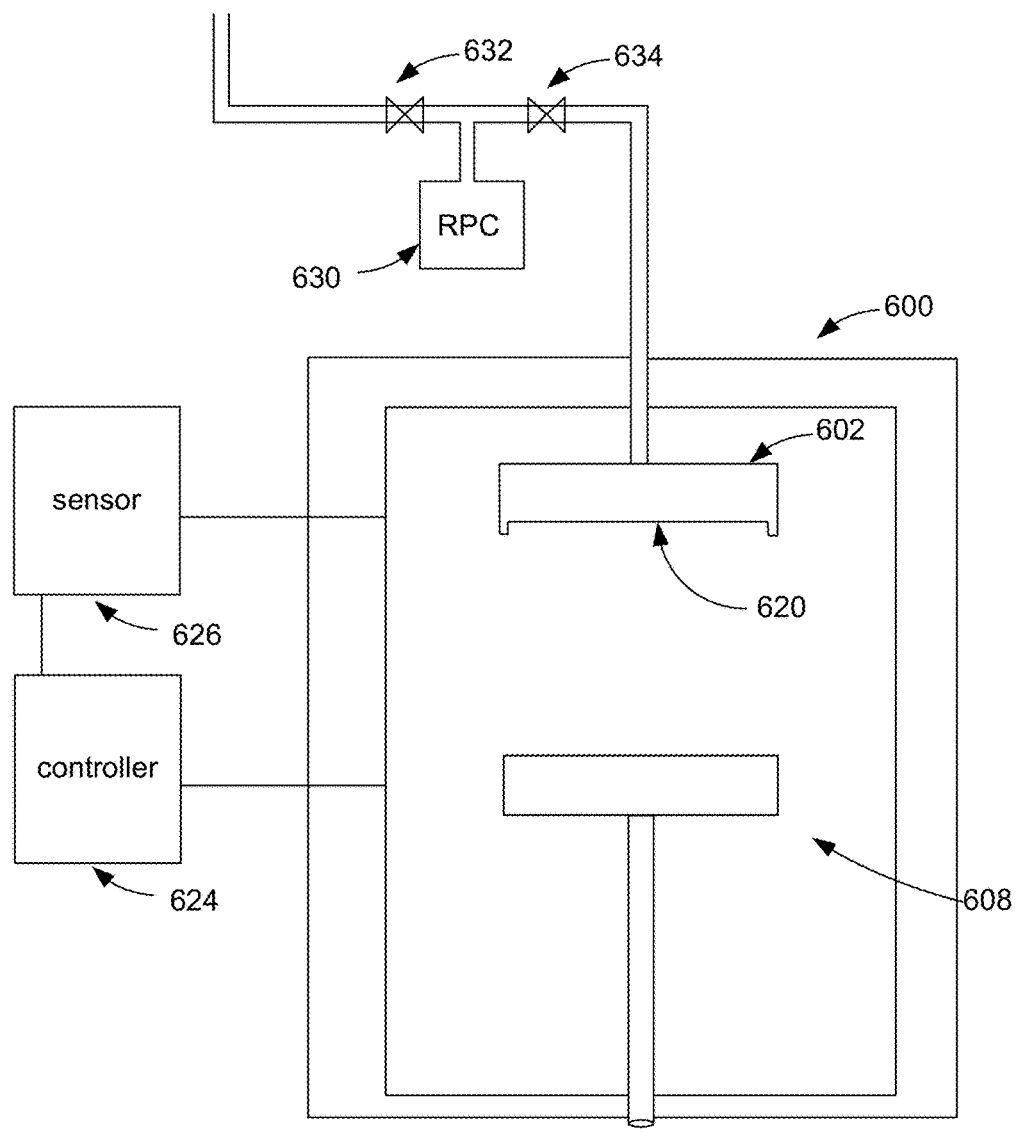
FIG. 6 is a diagram showing components of chamber suitable for carrying out tungsten deposition and etch-back processes in accordance with embodiments of the invention.

FIG. 6 shows a schematic representation of a chamber or station that may be used in an etch operation. The methods of the invention involve introducing an etchant, e.g., fluorine-based etchant into a reactor or chamber 600, having a pedestal 608 that supports a wafer on which tungsten is deposited. Atomic fluorine is generated in a remote plasma chamber 630. In operation, a fluorine-containing gas, e.g., $NF_3$, is introduced to the remote plasma chamber 630 via a valve 632. Atomic fluorine is generated therein. Valve 634 is opened to allow the atomic species to enter the chamber via the showerhead 602. FIG. 6 shows just one example of a remote plasma chamber; other arrangements and configurations may be used. Atomic species enter the chamber and etch the tungsten film (not shown) deposited on the wafer as discussed above. (One of skill in the art will understand that other species may be present in the plasma or gases exiting the showerhead into the reactor. For example, the species entering the deposition chamber from the showerhead may include $NF_3$ and $NF_x$ as well as atomic fluorine. No ions or electrons are present in significant amounts. At higher pressures, $NF_3$ as well as $F_2$ is present.) By appropriately adjusting the pressure, the showerhead acts as a tunable source of the desired atomic and/or molecular fluorine etchant. Note that preceding the etch process, deposition precursors may enter the showerhead to deposit the tungsten film on the wafer.

Sensors 626 represent gas sensors, pressure sensors etc. that may be used to provide information on reactor conditions. Examples of chamber sensors that may be monitored during the clean include mass flow controllers, pressure sensors such as manometers, thermocouples located in pedestal, and infra-red detectors to monitor the presence of a gas or gases in the chamber.

As the tungsten is removed from the chamber, tungsten hexafluoride is produced. The tungsten hexafluoride may be sensed by sensors 726, providing an indication of the progress of the etch. The tungsten hexafluoride is removed from the reactor via an outlet (not shown) such that once the clean is complete, the sensor will sense no tungsten hexafluoride. Sensors 626 may also include a pressure sensor to provide chamber pressure readings.

Molecular fluorine may be supplied to the chamber by methods other than using a remote plasma chamber to generate atomic fluorine and regulating the pressure so that the atomic fluorine combines into molecular fluorine as described above. For example, fluorine gas may be allowed into the chamber from a fluorine gas supply. However, in embodiments that employ both atomic and molecular fluorine as described above, the use of the remote plasma chamber provides a simple way to switch between stages. Moreover, the remote plasma chamber allows the use of $NF_3$, which is easier to handle than molecular fluorine, as an inlet gas to the system. Certain embodiments may employ a direct (in-situ) plasma for the generation of atomic fluorine.

In certain embodiments, a system controller 624 is employed to control process conditions during deposition and removal operations. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and removal processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, remote plasma conditions such as RF power levels and the low frequency RF frequency, etchant flow rates or partial pressure, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. An etchant control program may include code for controlling the etchant flow rate and partial pressure, carrier gas flow rate and partial pressure, etch time, etc.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. Tungsten hexafluoride, or other etching byproduct, may be sensed to provide an indication of how much tungsten has been removed.

The foregoing describes implementation of embodiments of the invention in a single or multi-chamber semiconductor processing tool.

Applications

The present invention may be used to deposit thin, low resistivity tungsten layers for many different applications. One application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices.

In certain embodiments wherein the deposition process is used for bit line applications, the final thickness of the tungsten film is between 500 Å-2000 Å, with as-deposited film thicknesses between 500 Å-2500 Å. The process may also be used to deposit much thicker films if needed. Also as described above, the process may be used to deposit thin films having low resistivity, e.g., films of thickness between 100 Å-1000 Å. In general, the invention finds application in any environment where thin, low-resistivity tungsten layers are required.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. For example, although the above description describes primarily CVD deposition, the deposition-etch methods may also be employed with other types of tungsten deposition. It is therefore intended that the following appended claims be interpreted as including all such alterations, modifications, permutations, and substitute equivalents as fall within the true spirit and scope of the present invention.

What is claimed is:

1. A method of forming a tungsten layer on a substrate surface, the method comprising:
receiving a substrate having an exposed deposited tungsten layer on a planar surface of the substrate, wherein the deposited tungsten layer has a thickness T1; and
removing a top portion of the deposited tungsten layer to form a tungsten bulk layer having thickness Td on the planar surface, wherein Td is less than T1, wherein the top portion is between about 5% and 25% of the thickness T1 of the deposited tungsten layer; and
halting the removing once the top portion is removed and the tungsten bulk layer has a thickness of Td, and further comprising introducing a fluorine-containing compound to a remote plasma generator upstream of a chamber that houses the substrate, generating atomic fluorine within the remote plasma generator, and flowing atomic fluorine from the remote plasma generator to the chamber to remove the top portion of the deposited tungsten layer.

2. The method of claim 1, wherein the top portion is between about 5% and 15% of the thickness T1 of the deposited tungsten layer.

3. The method of claim 1, wherein the top portion is about 10% of the thickness T1 of the deposited tungsten layer.

4. The method of claim 1, wherein the partial pressure of the fluorine-containing compound introduced to the remote plasma generator is at least about 0.7 Torr.

5. The method of claim 1, wherein the partial pressure of the fluorine-containing compound introduced to the remote plasma generator is at least about 1 Torr.

6. The method of claim 1, wherein Td is between about 500 Å and 2000 Å.

7. The method of claim 1, wherein the reflectivity of the tungsten bulk layer having thickness Td is 15% greater than that of a bare silicon wafer.

8. The method of claim 1, wherein the resistivity of the tungsten bulk layer having thickness Td is less than that of a tungsten film of thickness Td deposited by chemical vapor deposition with no subsequent etch operations.

9. The method of claim 1, wherein the reflectivity of the tungsten bulk layer having thickness Td is greater than that of a tungsten film of thickness Td deposited by chemical vapor deposition with no subsequent etch operations and the roughness of the tungsten bulk layer having thickness Td is less than that of a tungsten film of thickness Td deposited by chemical vapor deposition with no subsequent etch operations.

10. The method of claim 1, after removing the top portion, etching the tungsten bulk layer having thickness Td to define one or more features.

11. The method of claim 1, further comprising patterning the tungsten bulk layer to form an interconnect, via, or contact having a thickness of Td.

12. A method of forming a tungsten layer on a substrate surface, the method comprising:

receiving a substrate having a deposited tungsten layer on the substrate surface, wherein the deposited tungsten layer has a thickness T1; and removing a top portion of the deposited tungsten layer to form a tungsten bulk layer having thickness Td, wherein Td is less than T1 and wherein no more than the top portion is removed, wherein the top portion is between about 5% and 25% of the thickness T1 of the deposited tungsten layer, further comprising introducing a fluorine-containing compound to a remote plasma generator upstream of a chamber that houses the substrate, generating atomic fluorine within the remote plasma generator, and flowing atomic fluorine from the remote plasma generator to the chamber to remove the top portion of the deposited tungsten layer.

13. The method of claim 12, wherein the top portion is between about 5% and 15% of the thickness T1 of the deposited tungsten layer.

14. The method of claim 12, wherein the partial pressure of the fluorine-containing compound introduced to the remote plasma generator is at least about 0.7 Torr.

15. The method of claim 12, wherein the partial pressure of the fluorine-containing compound introduced to the remote plasma generator is at least about 1 Torr.

16. The method of claim 12, wherein Td is between about 500 Å and 2000 Å.

17. The method of claim 12, wherein the reflectivity of the tungsten bulk layer having thickness Td is 15% greater than that of a bare silicon wafer.

18. The method of claim 12, wherein the substrate surface is planar.

19. The method of claim 12, wherein the substrate surface includes one or more raised or recessed features.

20. The method of claim 12, further comprising patterning the tungsten bulk layer to form an interconnect, via, or contact having a thickness of Td.

* * * * *